(12) United States Patent
Chiu et al.

(10) Patent No.: US 6,472,912 B1
(45) Date of Patent: Oct. 29, 2002

(54) DEVICE FOR POWER SUPPLY DETECTION AND POWER ON RESET

(75) Inventors: Hon Kin Chiu, Hayward; Wai Cheong Chan, Sunnyvale, both of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/755,216

(22) Filed: Jan. 4, 2001

(51) Int. Cl.[7] ............................................... H03K 17/22
(52) U.S. Cl. ........................................ 327/143; 327/198
(58) Field of Search ................................. 327/143, 198, 327/543

(56) References Cited

U.S. PATENT DOCUMENTS

| | | | | | |
|---|---|---|---|---|---|
| 4,309,627 A | * | 1/1982 | Tabata | ........................ | 327/143 |
| 4,716,323 A | * | 12/1987 | Wada et al. | ................. | 327/143 |
| 5,300,822 A | * | 4/1994 | Sugahara et al. | ........... | 327/143 |
| 5,302,861 A | * | 4/1994 | Jelinek | ........................ | 327/143 |
| 5,528,182 A | * | 6/1996 | Yokosawa | ................... | 327/143 |
| 5,883,532 A | * | 3/1999 | Bowers | ....................... | 327/143 |
| 5,959,477 A | * | 9/1999 | Chung | ......................... | 327/143 |
| 6,118,315 A | * | 9/2000 | Guedj | ......................... | 327/143 |
| 6,137,324 A | * | 10/2000 | Chung | ......................... | 327/143 |
| 6,181,173 B1 | * | 1/2001 | Homoi | ........................ | 327/143 |

* cited by examiner

*Primary Examiner*—Terry D. Cunningham
(74) *Attorney, Agent, or Firm*—Wagner, Murabito & Hao LLP

(57) ABSTRACT

A circuit for power supply detection and power on reset. The circuit comprises two separate component groups for producing separate currents which vary in response to the level of a voltage source. For example, each may have a non-linear DC relationship between the power supply and a current of the respective component groups. Furthermore, the DC voltage to current relationship of two groups is different. The circuit has an output with two modes. The two component groups are operable to force the output into one mode when the voltage source is above a threshold and a second mode when the voltage source is below the threshold. Therefore, the circuit is operable to detect when the supply voltage has dropped below a threshold and to also serve as a power on reset. However, the circuit does not rely on the threshold voltage of a transistor to trigger the output.

11 Claims, 4 Drawing Sheets

$$Vi = VDD \times \frac{Z2}{Z1 + Z2}$$

DEVICE FOR POWER SUPPLY DETECTION AND POWER ON RESET

TECHNICAL FIELD

The present invention generally pertains to the field of electronic circuits. More particularly, the present invention is related to a technique for detecting that a power supply is below a pre-determined level and generating an indicator signal.

BACKGROUND ART

In some applications such as the Real Time Clock for PC, it is necessary to detect the power supply level and generate an indicator signal when the power supply has dropped below a threshold level. This is because below the threshold level, circuit operations are not guaranteed.

One conventional method for a voltage level detection circuit uses bandgap reference comparison. Referring to FIG. 1, a reference voltage, $V_{ref}$ 106, the desired threshold level, is generated by bandgap reference 102 and is compared with the power supply 104 via differential amplifier 104. When the supply 104 drops below $V_{ref}$ 106, $V_X$ 108 will change. This circuit 100 can be accurate; however, it cannot be used as power on reset because $V_{ref}$ 106 is not available when the power is just switched on. Also, bandgap reference voltage level that is accurate over a wide temperature range centers only around 1.2 Volts. Therefore, a relatively limited range of threshold voltages may be detected. Furthermore, the bandgap reference increases the number of components in the voltage level detection circuit.

A second conventional method is a voltage divider configuration. Referring to FIG. 2, in this configuration, $Z_1$ 201 and $Z_2$ 202 are two impedances (e.g., resistors). They are chosen to have a ratio such that when $V_{DD}$ 204 is at a normal operating level $V_X$ 208 is low because transistor $M_1$ 206 is on. When $V_{DD}$ 204 drops to the selected threshold, $V_i$ 210 will be lower than the threshold of $M_1$ 206. At that point, $V_x$ 208 will switch to high because transistor $M_1$ 206 is off. This circuit 200 can be used as power on reset. However, since the threshold of $M_1$ 206 varies with temperature and process, the selected threshold of $V_{DD}$ 204 at which $V_x$ 208 will change, therefore, also varies with temperature and process.

FIG. 3 illustrates how temperature and process variations may affect $V_{GS}$ versus $I_{DS}$ of a NMOS transistor. The graph 300 shows the variation to be over 400 mV between a high temperature (e.g., 125 degrees Celsius) fast corner device 302 and a low temperature (e.g., −40 degrees Celsius) slow corner device 308. Comparing the high temperature slow corner device 306 and the low temperature fast corner device 304 with the other curves reveals that even one of the variations (process or temperature) may account for approximately 200 mV differences in the device threshold. Moreover, in an actual circuit, the change in $V_i$ could be as high as 1 Volt due to the amplification effect of the impedance ratio.

Thus, a need has arisen for a technique for detecting a power supply is at a low voltage level. A further need exists for such system which also functions as a power on reset indicator. A still further need exists for a technique which may be implemented with a relatively simple circuit. An even further need exists for a technique which is capable of detecting a wide range of power supply thresholds. A still further need exists for a technique which is not highly sensitive to semiconductor process variations and ambient temperature variations.

SUMMARY

The present invention provides a circuit for detecting that the level of a power supply is at a low level. Additionally, the circuit also functions as a power on reset indicator. The present invention also provides for a technique which may be implemented with a relatively simple circuit. A circuit of the present invention is capable of detecting a wide range of power supply thresholds. Additionally, the technique is not highly sensitive to semiconductor process variations and ambient temperature variations.

A circuit for power supply detection and power on reset is disclosed. In one embodiment, the circuit comprises two separate component groups for producing separate currents which vary in response to the level of a voltage source. For example, each may have a non-linear DC relationship between the power supply and a current of the respective component group. Furthermore, the DC voltage to current relationship of two groups is different. The component groups may be, for example, current sources or sinks. The circuit has an output with two modes. The two component groups are operable to force the output into one mode when the voltage source is above a threshold and a second mode when the voltage source is below the threshold. Therefore, the circuit is operable to detect when the supply voltage has dropped below a threshold and to also serve as a power on reset. However, the circuit does not rely on the threshold voltage of a transistor to trigger the output. Consequently, it provides for better tolerance than conventional voltage divider circuits, as it is not highly sensitive to semiconductor processing and ambient temperature variations.

These and other advantages of the present invention will no doubt become obvious to those of ordinary skill in the art after having read the following detailed description of the preferred embodiments which are illustrated in the various drawing figures.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Circuit for Power Supply Detection and Power on Reset

Figure 1:
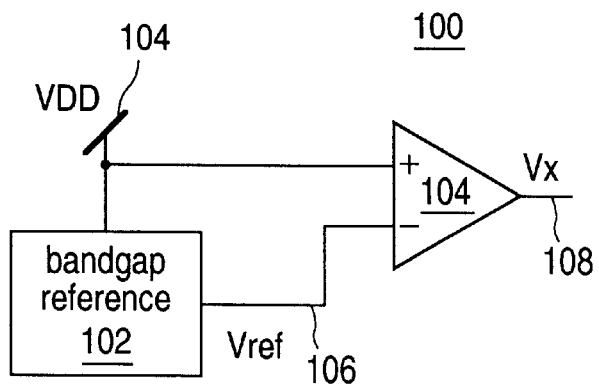
FIG. 1 is a block diagram of a bandgap reference voltage detector, according to conventional art.
Figure 2:
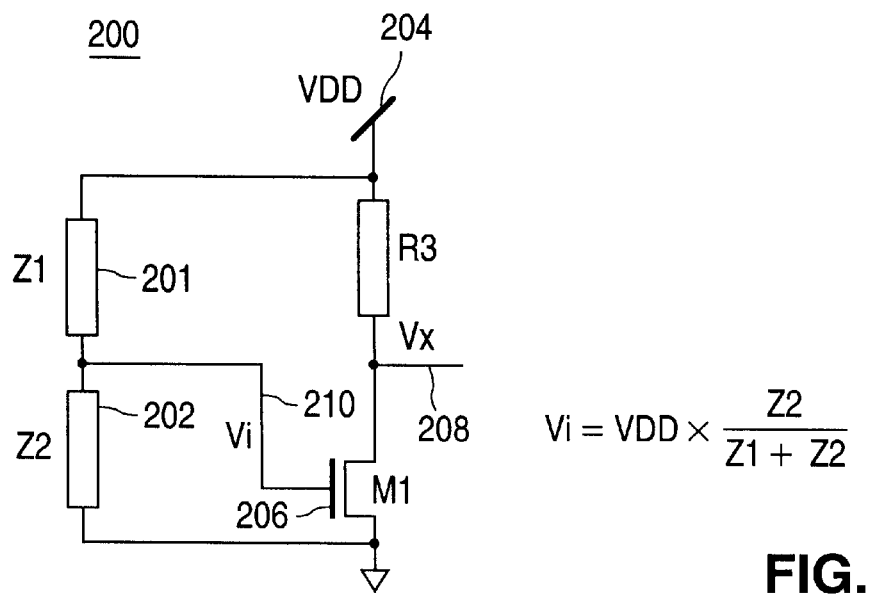
FIG. 2 is a schematic diagram of a voltage divider voltage detector, according to conventional art.
Figure 4:
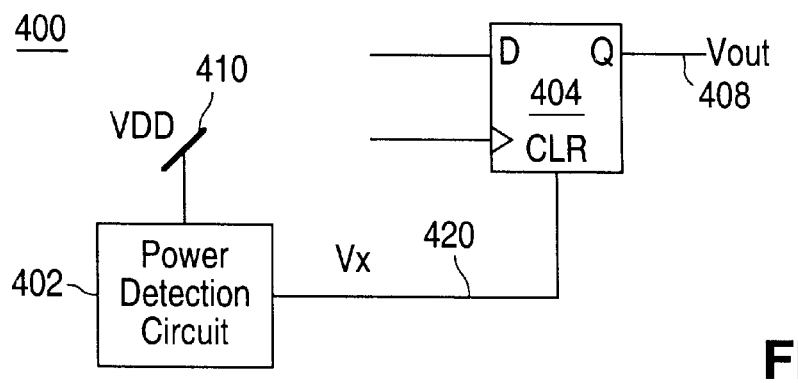
FIG. 4 is a block diagram of a voltage detection circuit, in which an embodiment of the present invention may reside.
Figure 3:
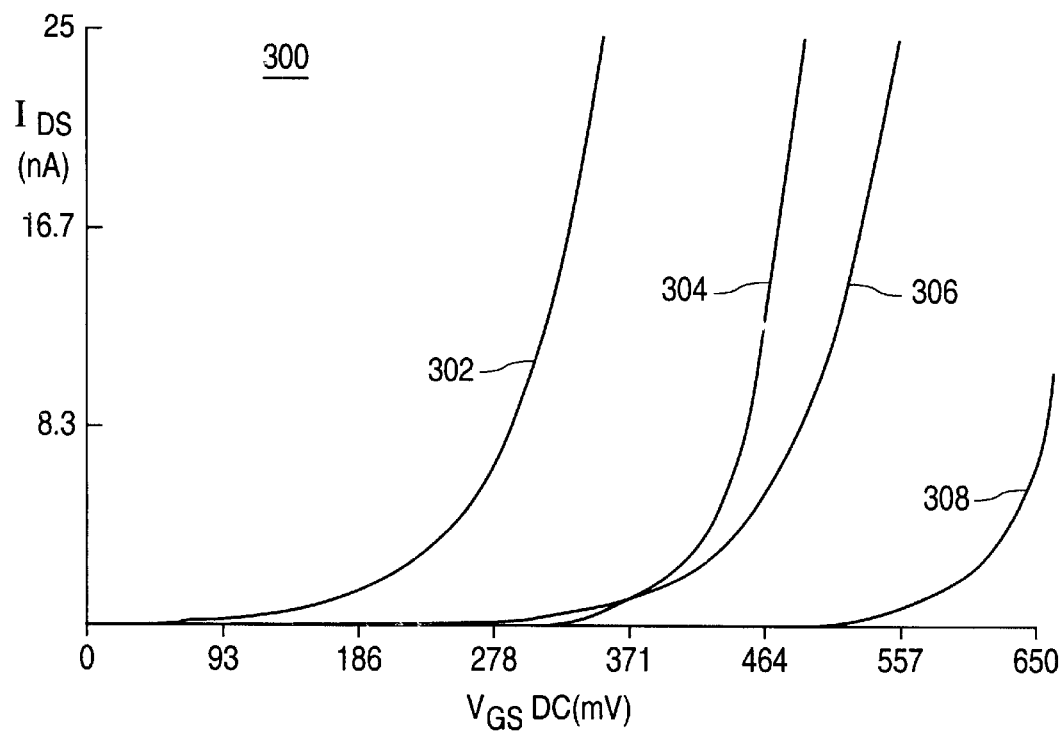
FIG. 3 is a graph illustrating how gate to source voltage versus drain to source current varies with semiconductor processing and ambient temperature.

Embodiments of the present invention may be used in a voltage detection circuit, as illustrated in FIG. 4. When the supply voltage 410 drops below a threshold, the power detection circuit 402 will generate a clear signal to the latch 404, which will reset $V_{out}$ 408 to low. By checking $V_{out}$ 408, it can be determined that $V_{DD}$ 410 has dropped and the logic values of the other parts of the chip cannot be trusted.

Figure 5:
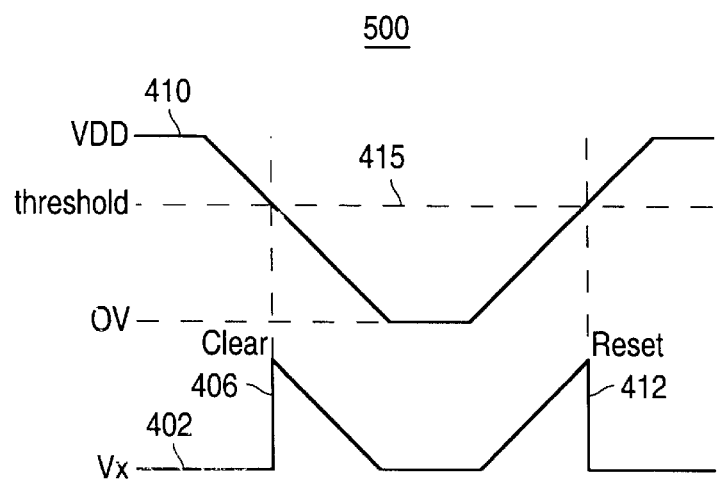
FIG. 5 is a graph illustrating the relationship between the power supply voltage and the output voltage of the voltage detection circuit of FIG. 4, which an embodiment of the present invention provides.

FIG. 5 illustrates the relationship between $V_{DD}$ 410 and $V_x$ 420. When $V_{DD}$ is above the threshold 415, $V_x$ 420 is low. However, when $V_{DD}$ 410 drops below the threshold 415, $V_x$ 420 goes high. Thus, $V_x$ 420 may be used as a clear signal 406 to the latch 404. As $V_{DD}$ 410 falls further, $V_x$ 420 must also fall. As $V_{DD}$ 410 rises, $V_x$ 420 will follow $V_{DD}$ 410 up. When $V_{DD}$ crosses above the threshold 415, $V_x$ 420 will go low. Hence, $V_x$ 420 can be used as a reset signal 412. Consequently, the power detection circuit 402 also functions as a power on reset circuit. Embodiments of the present invention produce on output signal $V_x$ 420 that is substantially compliant with the diagram 500 of FIG. 5.

Figure 6:
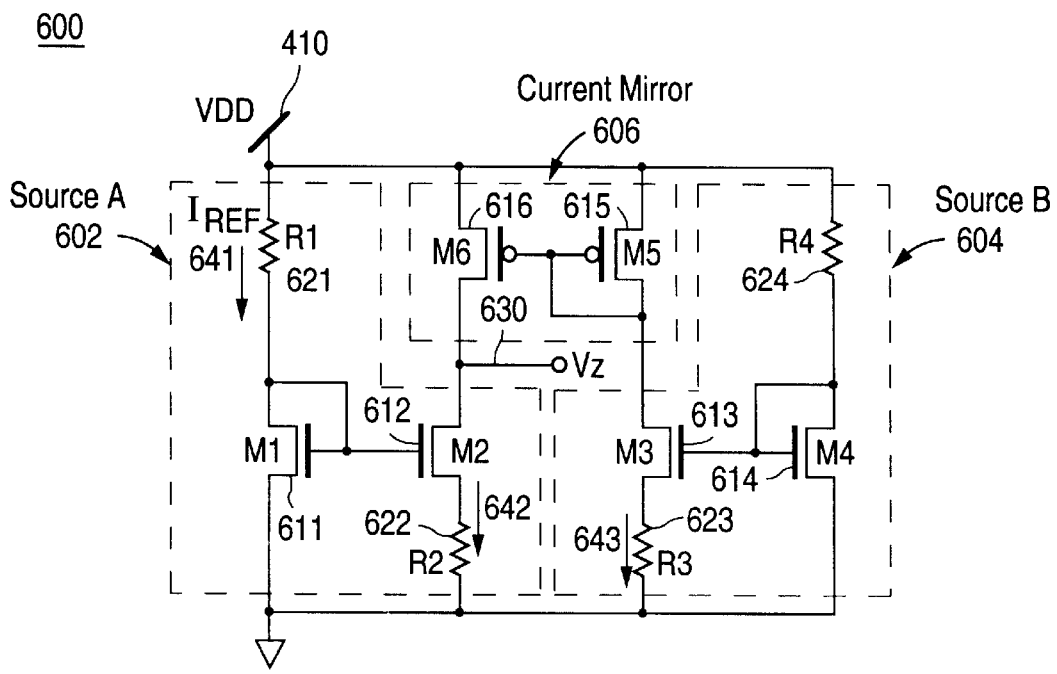
FIG. 6 is a schematic illustrating a high accuracy power supply detection circuit, according to an embodiment of the present invention.

FIG. 6 illustrates a circuit 600 which gives better control on the threshold level 415 without the need of a bandgap reference. The circuit 600 comprises two current sources (602, 604) and a current mirror 606. By using different sizes for transistors M1, M2, M3, and M4 (611–614) and different resistances for resistors R1–R4 (621–624), different current-voltage (I–V) curves for source A 602 and source B 604 will be achieved. Embodiments make use of this difference to detect the level of $V_{DD}$ 410.

Figure 7:
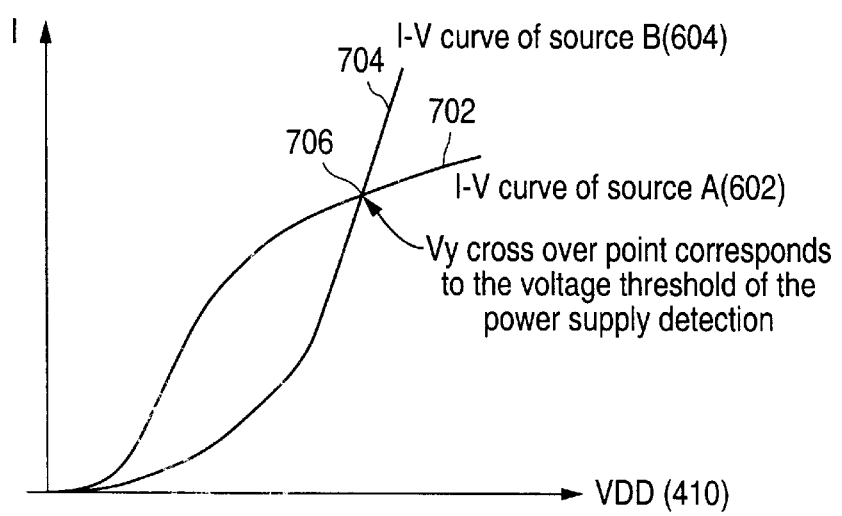
FIG. 7 is a graph illustrating the load lines of a power detection/power on reset circuit, according to an embodiment of the present invention.

For example, FIG. 7 illustrates the different direct current (DC) I–V curves (702, 704) for the two current sources (602, 604). The non-linear curves (702, 704) intersect at a single point $V_y$ 706, which corresponds to the voltage threshold 415 of the power supply detection. For example, when $V_{DD}$ 410 is above $V_y$ 706, the output 630 of circuit 600 will be high. When $V_{DD}$ 410 is below $V_y$ 706, the output 630 of circuit 600 will be low. Thus, in a first voltage source region (left of $V_y$ 706) the current response (e.g., load lines 702, 704) of current source A 602 is greater than the load line of current source B 604 and in a second voltage source region (right of $V_y$ 706) the load line of current source A 602 is less than the load line of current source B 604. The crossover point $V_y$ may be made to occur at a wide range of power supply 410 levels by choosing suitable values for the resistors (621–624) and transistors (611–614). Consequently, the embodiments of the present invention may detect a threshold voltage 415 for a wide range of values.

The circuit mechanisms to achieve these outputs will be understood by an examination of the circuit 600 of FIG. 6. When $V_{DD}$ 410 is higher than $V_y$ 706, the output $V_z$ 630 will be pulled high by transistor M6 616. When $V_{DD}$ 410 is below $V_y$ 706, $V_z$ 630 will be pulled low by transistor M2 612. In this fashion, a different output mode may be achieved at different power supply 410 levels. The circuit 600 does not rely on a transistor either turning on or off to switch between the two output modes. Furthermore, the circuit 600 may be used as a power on reset circuit, as well as indicating when the power source 410 has dropped below a threshold 415.

The circuit 600 of FIG. 6 does not require bandgap or comparator circuits. It also does not use the threshold voltage of a MOS transistor as a reference. Consequently, the tolerance of detection may be substantially better than is achieved by conventional circuits.

The circuit 600 of FIG. 6 may be described as having a first plurality of elements for producing a current 642 in response to the level of the power supply 410. For example, this is done by current source A 602, which comprises R1 621, M1 611, M2 612, and R2 622. Current source A 602 has a reference current 641, largely determined by the size of the resistor R1 621 and the level of the power supply 410. Current source A also has source output current 642 flowing through M2 612 and R2 622.

In a similar fashion, circuit 600 has a second plurality of elements (e.g., current source B 604) for producing a current 643 that varies in response to the level of the voltage source 410. Current source B 604 comprises R4 624, M4 614, R3 623, and M3 613. The two current sources (602, 604) have different responses to the voltage source 410 by choosing suitable values for the resistors (621–624) and the transistors (611–614). The current mirror 606 turns around the output current 643 of current source B 604 such that the output current of the two sources are effectively in series.

Figure 8:
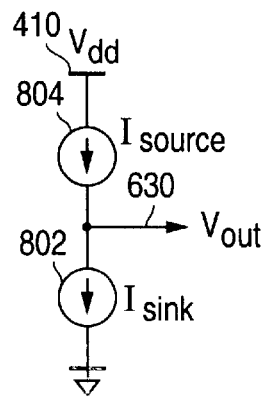
FIG. 8 is a simplified illustration of the functioning of a circuit for power supply detection, according to an embodiment of the present invention.

The present invention may be analyzed by simplifying the circuit 600 of FIG. 6 to that of two current sources 802, 804, as seen in FIG. 8. In FIG. 8, the current source B 604 of FIG. 6 is represented by current source 804. Current source A 602 of FIG. 6 is represented by current sink 802. The current mirror 606 of FIG. 6 is not represented in FIG. 8 as it functions to provide the output current 643 of current source B 604 to the output $V_z$ 630. As stated herein, the output 630 may be forced between two modes, in response to the power supply 410 level. Embodiments achieve this by constructing current sources (or sinks) with different non-linear DC I-V curves.

Figure 9:
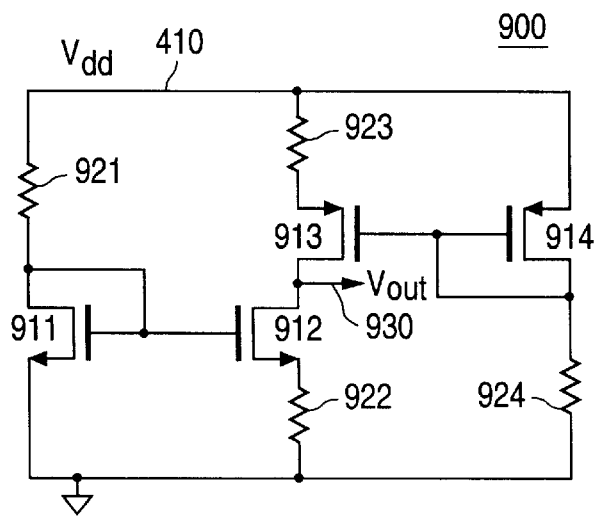
FIG. 9 is a schematic illustrating a high accuracy power supply detection circuit with two current sources and no current mirror, according to an embodiment of the present invention.
Figure 10:
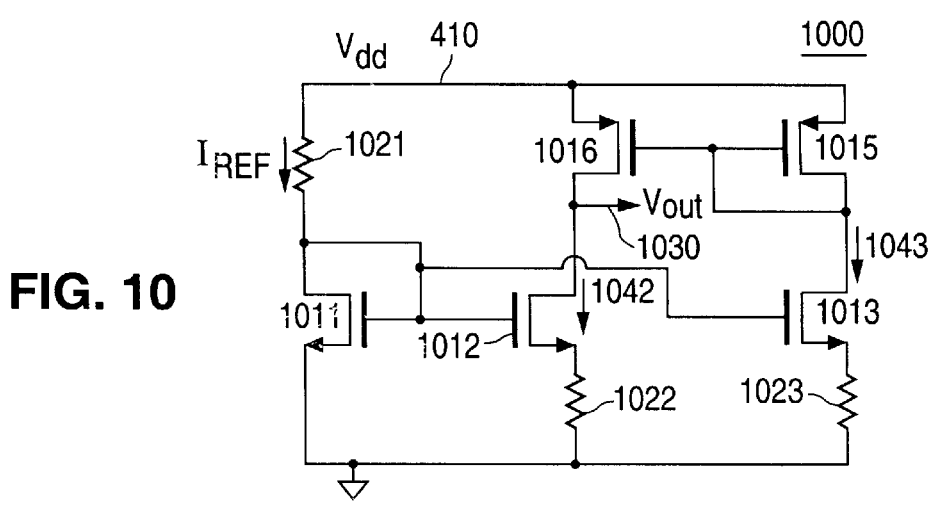
FIG. 10 is a schematic illustrating a high accuracy power supply detection circuit, according to an embodiment of the present invention.

The present invention may be implemented with a variety of circuit configurations. FIG. 9 and FIG. 10 illustrate two additional embodiments that function substantially similar to the embodiment of FIG. 6, as described herein. Referring to FIG. 9, a first current source is implemented by resistors 921 and 922 and transistors 911 and 912. A second current source is implemented with resistors 923 and 924 and transistors 913 and 914. The output 930 may be forced between two modes in response to the power supply 410 level, as per the discussion of FIG. 8. The present invention is well suited to operate with MOSFET as well as bipolar technology.

FIG. 10 illustrates a circuit 1000 of another embodiment. A first group of elements (e.g., resistors 1021 and 1022 along with transistors 1011 and 1012) provide a current 1042 in response to the voltage source 410. A second group of elements (e.g., resistors 1021 and 1023 along with transistors 1011 and 1013) provide another current 1043 in response to the voltage source 410. Thus, this embodiment is operable to utilize the reference current $I_{REF}$ for both groups of elements. The circuit 1000 also has a current mirror formed by transistors 1015 and 1016 for providing the current 1043 of transistor 1013 to the output 1030.

In the circuit of FIG. 10 exemplary values for the components are: resistor 1021, 7 Mega-Ohms; resistor 1022, 3 Mega-Ohms; resistor 1023, 2 Mega-Ohms. An exemplary ratio of transistor widths for transistors 1011, 1022, and 1023 respectively is 3:14:5. Other values may be used as well. Transistors 1016 and 1015 are constructed with the substantially the same width and length.

Therefore, it will be seen that embodiments of the present invention provide a circuit for detecting that the level of a power supply is at a low level. Embodiments of the present invention function as a power on reset indicator as well. Embodiments provide for a technique which may be implemented with a relatively simple circuit and are capable of detecting a wide range of power supply thresholds. Additionally, the technique is not highly sensitive to semiconductor process variations and ambient temperature variations.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

We claim:

1. A circuit for monitoring the level of a voltage comprising:
   a first circuit for producing a current which varies in response to the level of said voltage, said first circuit comprising:
      a first resistor coupled to said voltage;
      a first transistor coupled to said resistor;
      a second transistor with its gate coupled to the gate of said first transistor;
   a second circuit coupled to said first circuit and for producing a current which varies in response to the level of said voltage, said first and second circuits having different responses to said voltage, said second circuit comprising:
      a second resistor coupled to said voltage;
      a third transistor coupled to said resistor;
      a fourth transistor with its gate coupled to the gate of said third transistor, wherein said first, second, third, and fourth transistors have different widths;
   said circuit having an output taken from said second transistor operable to go between two modes in response to the level of said voltage.

2. The circuit for monitoring of claim 1 wherein said first and second circuits are further operable to force said output between said two modes in response to the level of said voltage.

3. The circuit for monitoring of claim 1 wherein the current responses of said first and said second circuits to said voltage have a first voltage region in which the current response of said first plurality is greater than current response of said second plurality and a second voltage region in which the current response of said first plurality is less than the current response of said second plurality.

4. The circuit for monitoring of claim 1 wherein said output is at a low level when said voltage is above a threshold voltage and substantially tracks said voltage when said voltage is below said threshold.

5. The circuit for monitoring of claim 1 wherein said first and said second resistors have different values.

6. The circuit for monitoring of claim 1 wherein said output is operable to go between said two modes without any of said transistors going between an on and an off state.

7. A circuit for detecting the level of a voltage source comprising:
   a current source having a first relationship between said voltage source and an output current of said current source, said current source comprising:
      a first resistor coupled to said voltage source,
      a first transistor coupled to said resistor, and
      a second transistor with its gate coupled to the gate of said first transistor;
   a current sink coupled to said current source, said sink having a second relationship between said voltage source and an output current of said sink, said current sink comprising:
      a second resistor coupled to ground,
      a third transistor coupled to said resistor and coupled to said gate
      of said first transistor; and
   said circuit having an output with a first and a second mode, wherein said current source and said current sink force said output between said first and said second modes in response to said level of said voltage source, said output taken from said second transistor, wherein said second and said third transistors have different widths.

8. The circuit of claim 7 wherein said output is at a low level when said voltage is above said threshold and substantially tracks said voltage source when said voltage source is below said threshold.

9. The circuit of claim 7 wherein said output is operable as a power on reset signal.

10. The circuit of claim 7 wherein said first and said second resistors have different values.

11. The circuit of claim 7 wherein said output is operable to go between said two modes without any of said transistors going between and on and an off state.

* * * * *